United States Patent [19]
Gabara

[11] Patent Number: 5,479,117
[45] Date of Patent: Dec. 26, 1995

[54] HYBRID DATA PROCESSING SYSTEM INCLUDING PULSED-POWER-SUPPLY CMOS CIRCUITS

[75] Inventor: Thaddeus J. Gabara, Murray Hill, N.J.

[73] Assignee: AT&T Corp., Murray Hill, N.J.

[21] Appl. No.: 371,254

[22] Filed: Jan. 11, 1995

[51] Int. Cl.$^6$ .................................................... H03K 19/20
[52] U.S. Cl. .............................. 326/81; 326/121; 326/98; 327/544
[58] Field of Search ............................. 326/98, 121, 81; 327/544

[56] References Cited

U.S. PATENT DOCUMENTS 5,324,992  6/1994  Maly ........................................ 307/265
5,329,169  7/1994  Ihara ..................................... 307/296.3

OTHER PUBLICATIONS

Seitz, Charles, Hot–Clock NMOS, 1985 Chapel Hill Conference on VLSI, 1985.
T. Gabara, "Pulsed Power Supply CMOS–PPS CMOS", 1994 IEEE Symposium on Low Power Electronics, Oct. 10–12, 1994, pp. 98–99.

*Primary Examiner*—Edward P. Westin
*Assistant Examiner*—Andrew Sanders

[57] ABSTRACT

An advantageous hybrid data processing system includes both conventional CMOS circuitry and low-power-dissipation pulsed-power-supply (PPS) CMOS circuitry. To enable the different types of circuitry in the system to communicate with each other, data signal representations that are in a PPS format must be converted to corresponding conventional CMOS-formatted data signals before being processed by the CMOS circuitry. Similarly, conventional CMOS data signals must be converted to corresponding PPS-formatted representations before the signals can be processed by the PPS circuitry.

7 Claims, 4 Drawing Sheets

HYBRID DATA PROCESSING SYSTEM INCLUDING PULSED-POWER-SUPPLY CMOS CIRCUITS

BACKGROUND OF THE INVENTION

This invention relates to low-power-dissipation pulsed-power-supply (PPS) complementary metal-oxide-semiconductor (CMOS) circuits and, more particularly, to interfacing PPS circuits with conventional CMOS circuits in a hybrid data processing system.

It is known that low-power-dissipation operation of a conventional CMOS circuit fabricated in integrated-circuit (IC) form can be achieved if the power supply lead of the circuit is ramped repetitively between VDD and VSS. During the so-called power-down phase of each ramped cycle, the state of the circuit is stored on parasitic capacitances. This quasi-static CMOS circuit technique is called pulsed-power-supply CMOS and is characterized by a power dissipation property that is typically approximately an order of magnitude less than that of conventional CMOS. The technique is described, for example, in "Pulsed Power Supply CMOS—PPS CMOS" by T. J. Gabara, *Proceedings of 1994 IEEE Symposium on Low Power Electronics.*, San Diego, Calif., October 10–12, 1994, pages 98–99. Further, the technique is described in T. J. Gabara's copending commonly assigned designated U.S. patent application Ser. No. 08/225,950, filed Apr. 8, 1994.

In some cases of practical importance, it is advantageous to design a hybrid data processing system that comprises an assemblage of IC chips including both conventional and PPS CMOS chips. In such a system, the data signal representations employed on the PPS chips are inherently different from those utilized on the conventional CMOS chips. Thus, to achieve communication among such dissimilar chips, some instrumentality is needed in a hybrid system to convert conventional CMOS data representations to the PPS data format, and vice versa. Without some simple and effective way of making these conversions, the advantages of incorporating PPS chips into a data processing system could not be realized.

SUMMARY OF THE INVENTION

In accordance with the principles of the present invention, a hybrid data processing system comprises both conventional fixed-power-supply CMOS circuits and PPS CMOS circuits. Circuitry is interposed between the conventional CMOS circuits and the PPS CMOS circuits for converting signals from a conventional CMOS format to a PPS CMOS format. Additional circuitry is interposed between the PPS CMOS circuits and the conventional CMOS circuits for converting signals from the PPS CMOS format to the conventional CMOS format.

In accordance with the invention, data signal representations from a conventional CMOS circuit are converted to data signal representations in the PPS CMOS format simply by applying the conventional signal representations to a PPS CMOS inverter circuit. The output of the inverter circuit comprises PPS signals suitable for processing by a low-power-dissipation PPS CMOS chip.

In further accord with the present invention, data signal representations in the PPS CMOS format are converted to conventional CMOS data signal representations before being transferred from a PPS CMOS chip to a conventional CMOS chip. This is done in a translator circuit in which the PPS data representations are applied to the respective inputs of a set of conventional CMOS inverter circuits. In turn, the outputs of these inverter circuits are respectively applied to a set of conventional flip-flops. In response to conventional clock signals applied to the flip-flops, conventional CMOS data signal representations appear at the outputs of the flip-flops.

In still further accord with the invention, the conventional clock signals utilized to time the operation of the flip-flops in the translator circuit are generated in the translator circuit itself. These conventional clock signals are generated in response to the application to the translator circuit of the PPS waveform and of PPS clock signals.

BRIEF DESCRIPTION OF THE DRAWING

A complete understanding of the present invention and of the above and other features and advantages thereof will be apparent from the detailed description below taken in conjunction with the accompanying drawing, in which.

DETAILED DESCRIPTION

Figure 1:
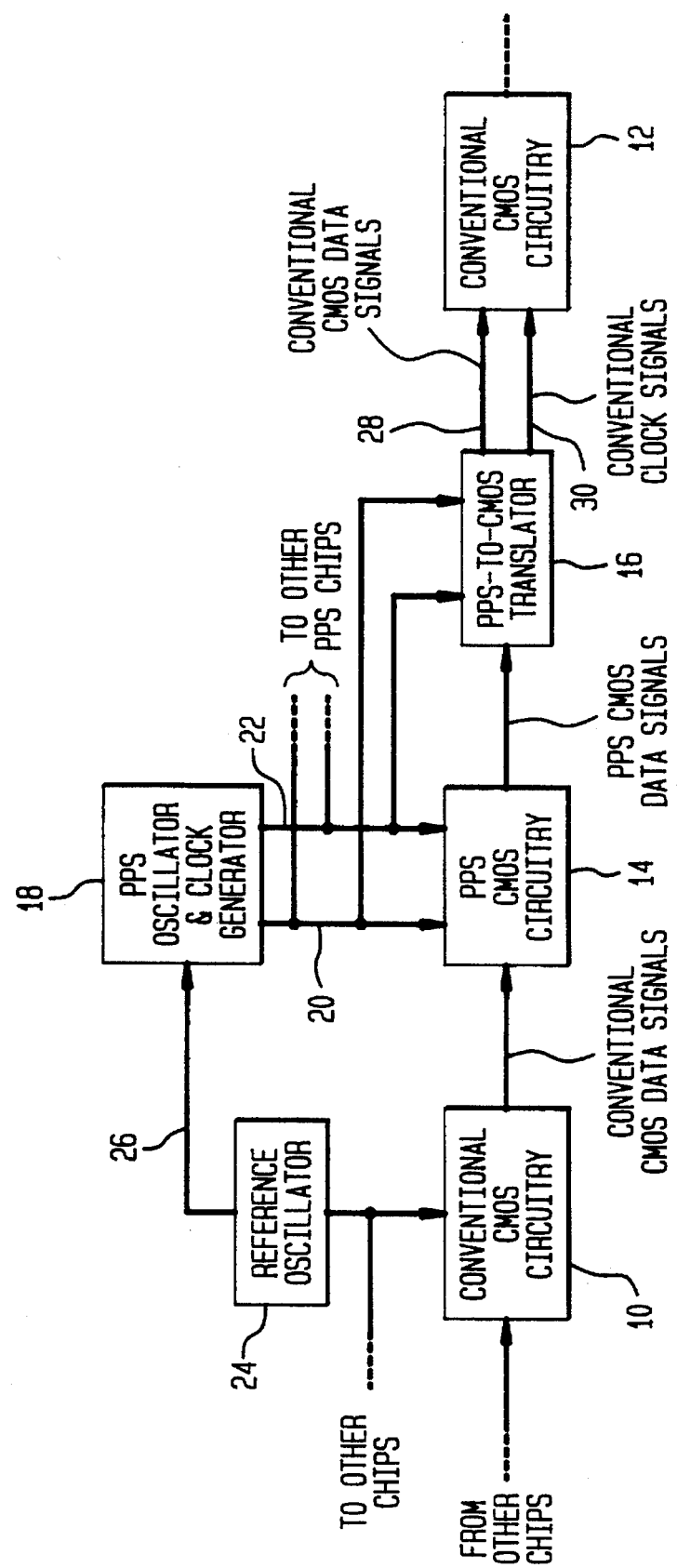
FIG. 1 is a simplified block-diagram representation of a specific illustrative system, including both conventional CMOS and PPS CMOS circuits, made in accordance with the principles of the present invention.

FIG. 1 depicts a portion of a specific illustrative hybrid data processing system that includes both conventional CMOS circuitry and PPS CMOS circuitry. By way of example, the conventional CMOS circuitry of the depicted system will be assumed to be on IC chips 10 and 12. Additionally, the system is shown as including an IC chip 14 that contains PPS CMOS circuitry.

In accordance with the invention, data signal representations generated by the conventional CMOS circuitry on the chip 10 are converted to corresponding PPS data signal representations before being processed by the PPS CMOS circuitry on the chip 14. Illustratively, as will be specified in detail later below in connection with the description of FIGS. 2 and 3, this conversion is carried out by simple circuitry included on the PPS chip 14. In that arrangement, data signals transmitted between the chips 10 and 14 will thus be in a conventional CMOS data format and subsequently, on the chip 14, will be converted to the PPS format.

Similarly, PPS data signal representations generated by the PPS CMOS circuitry on the chip 14 of FIG. 1 are converted to corresponding conventional CMOS data signal representations before being processed by the conventional CMOS circuitry on the chip 12. For schematic purposes, this conversion is shown in FIG. 1 as occurring in a separate box 16 (a PPS-to-CMOS translator) located between the chips 12 and 14. In practice, however, it is usually advantageous to actually include the translator 16 on the PPS chip 14. In that case, data signals transmitted between the chips 14 and 12 will be in a conventional CMOS data format.

As described above, both the CMOS-to-PPS and PPS-to-CMOS circuitry for converting data signal formats can advantageously be included on the PPS chip 14 of FIG. 1. As a result, both the data signals applied to and the data signals emanating from the chip 14 would in that case be indistinguishable from conventional CMOS data signals. As far as the overall system knows, the PPS chip 14 looks like and is thus completely interchangeable with a conventional CMOS chip.

In practice, a conventional simple oscillator circuit designed to generate a sinusoidal waveform can be utilized to power PPS CMOS circuits. Illustratively, such a standard oscillator circuit is included in the box designated 18 in FIG. 1. The oscillator in the box 18 thus supplies a so-called PPS waveform via lead 20 to the PPS chip 14 (and to the translator 16).

A relatively simple low-power-dissipation oscillator circuit suitable for generating sine-wave signals for driving PPS CMOS circuits includes an inductor connected in series with a capacitor. In practice, the capacitor of such a series-resonant path typically comprises the effective capacitance of the CMOS circuits to be driven. [A particularly advantageous oscillator circuit comprising such a series-resonant path is described in a copending commonly assigned U.S. patent application of T. J. Gabara (Case 25).]

Illustratively, the box 18 of FIG. 1 also includes a conventional PPS clock signal generator. The generator is designed to respond to sine-wave signals from the PPS oscillator in the box 18 by providing clock signals (described later below in connection with FIG. 5) that occur in synchronism with the output of the PPS oscillator. In turn, such clock signals are applied via lead 22 to the PPS chip 14 and to any other PPS chips connected to the lead 22 to control data flow on the driven chip(s). One particular advantageous way of generating these clock signals in response to the output of a PPS oscillator is described in a copending commonly assigned U.S. patent application of W. C. Fischer and T. J. Gabara (Case 1–24).

Moreover, it is necessary in practice to establish and maintain a synchronous relationship between the output of a reference oscillator or master timing source and the output of the PPS oscillator in the box 18 of FIG. 1. (In turn, a synchronized PPS oscillator will result in correspondingly synchronized PPS clock signals.) Thus, a reference oscillator 24, which supplies timing or clock signals to the chip 10 and to other chips included in the depicted system, is shown in FIG. 1. The oscillator 24 applies timing signals via lead 26 to the PPS oscillator and clock generator 18. In that way, overall synchronization of data flow in the system is assured. Illustratively, the reference oscillator 24 comprises a standard crystal oscillator exhibiting a high quality factor (Q) and excellent stability. [A particularly advantageous way of synchronizing the output of a PPS oscillator circuit to a master timing source by utilizing closed-loop frequency-control techniques is described in a copending commonly assigned U.S. patent application of A. E. Dunlop, W. C. Fischer and T. J. Gabara (Case 8-2-26).]

The PPS-to-CMOS translator 16 shown in FIG. 1 includes several inputs: PPS CMOS data signals generated by the PPS CMOS circuitry on the chip 14, PPS signals from the PPS oscillator portion of the box 18, and PPS clock signals from the PPS clock generator portion of the box 18. In response to such signals, the translator 16 converts the PPS data signals to conventional CMOS data signals which are then applied via lead (or bus) 28 to the conventional CMOS chip 12. Additionally, the translator 16 is capable itself of generating conventional CMOS clock signals. If desired, as described later below, these conventional clock signals generated by the translator 16 can be applied via lead 30 to time data flow on the chip 12.

Assume, for the sake of a particular illustrative example, that in a conventional CMOS data format "1" signals are represented in a so-called non-return-to-zero mode by a relatively positive direct-current voltage level designated VDD (which is, for example, +5 volts) and that "0" signals are represented therein by a relatively negative constant direct-current voltage level designated VSS (which is, for example, zero volts or a point of reference potential such as ground). Moreover, assume that in a PPS CMOS data format "1" signals are represented in a so-called return-to-zero mode by a couplet of PPS waveforms in two successive PPS pulse periods and that "0" signals are represented by the absence of a PPS signal in two successive PPS periods, as shown later below in connection with the description of FIG. 5.

Figure 5:
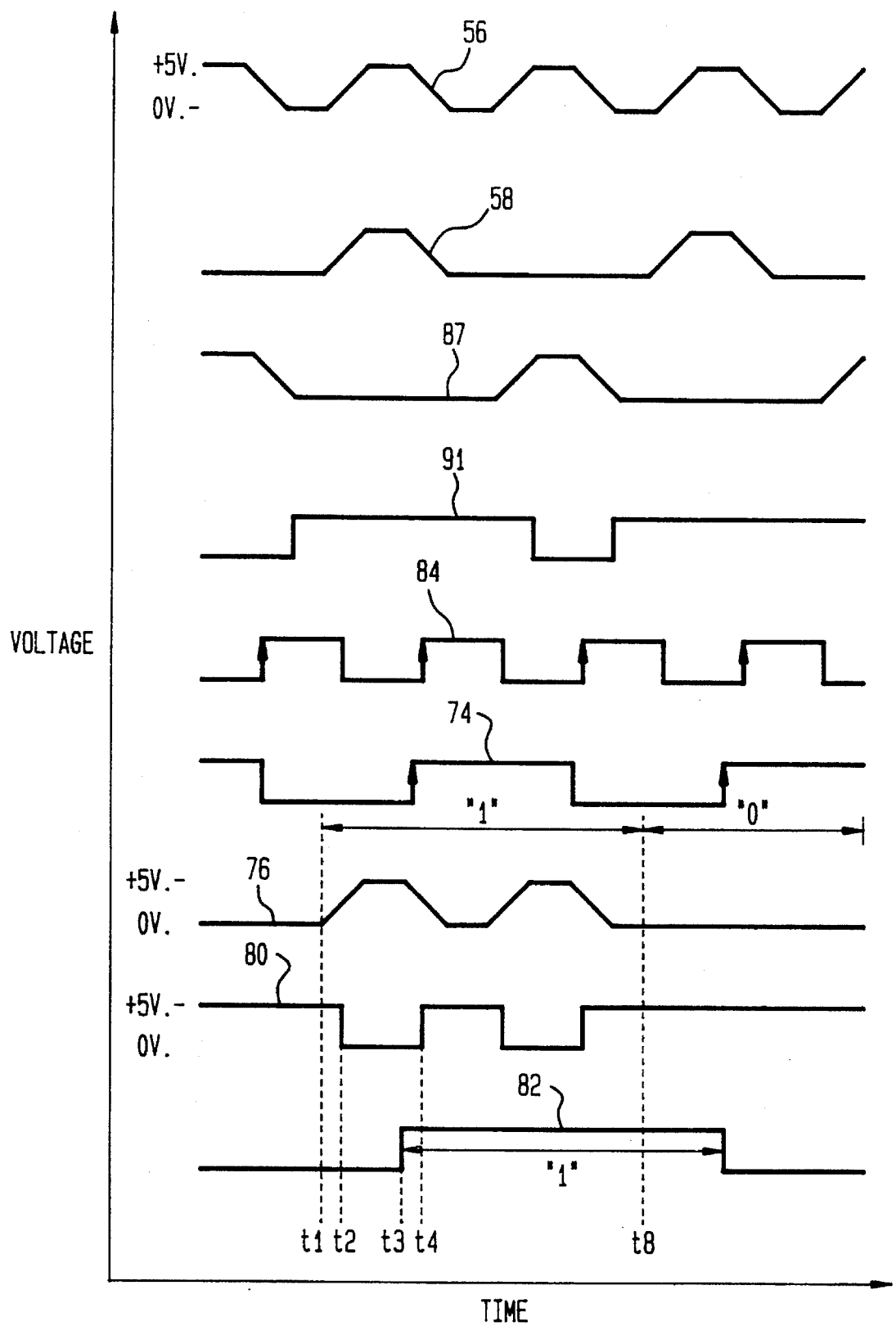
FIG. 5 is a timing diagram that is helpful in explaining the operation of the translator circuit shown in FIG. 4.

Furthermore, for ease in representation, it will be assumed herein that the PPS signal generated by the box 18 of FIG. 1, and applied to the chip 14 and the translator 16 to power PPS circuitry thereon, comprises a repetitively ramped-up and ramped-down waveform with momentary maxima and minima equal to +5 and zero volts, respectively. In principle, either actual sine-wave signals or shaped sine-wave signals comprising ramped signals of the particular type represented at the top of FIG. 5 are suitable for powering PPS CMOS circuits, as is well known. (If shaped sine-wave signals are utilized as the PPS signals, then the corresponding PPS clock signals will also be generated as ramped signals.)

Figure 2:
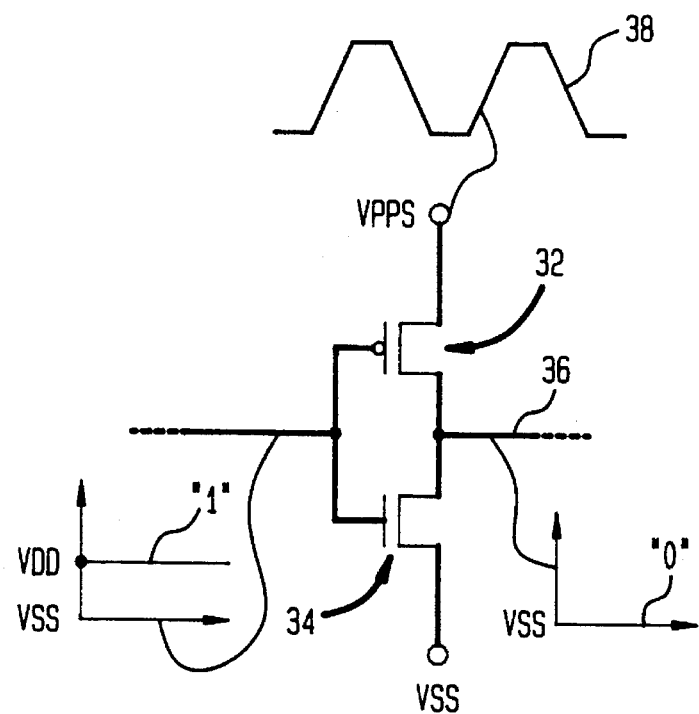
FIGS. 2 and 3 depict the manner in which conventional CMOS data signal representations are converted to PPS CMOS data signal representations.

Conversion of a "1" data signal in conventional CMOS format to an inverted replica thereof in PPS format is accomplished by, for example, a standard PPS CMOS inverter circuit of the type shown in FIG. 2. Application of a "1" input data signal (VDD or +5 volts) to the connected-together gate electrodes of p-channel MOS transistor device 32 and n-channel MOS transistor device 34 of FIG. 2 causes the device 32 to be rendered nonconductive and the device 34 to conduct. As a result, output lead 36 of the depicted inverter circuit is in effect directly connected to VSS (zero volts) via the relatively low-resistance source-to-drain path of the conducting device 34. Thus, as long as a "1" signal appears at the input of the FIG. 2 circuit, a "0" signal will appear on the output lead 36.

Further, as long as a "1" signal continues to be applied to the input of the inverter circuit of FIG. 2, the PPS source (designated VPPS) connected to the source electrode of the nonconducting p-channel device 32 is effectively isolated from the output lead 36. As a result, the PPS waveform (designated by reference numeral 38 in FIG. 2) supplied by the PPS oscillator of FIG. 1 does not appear on the output lead 36.

Figure 3:
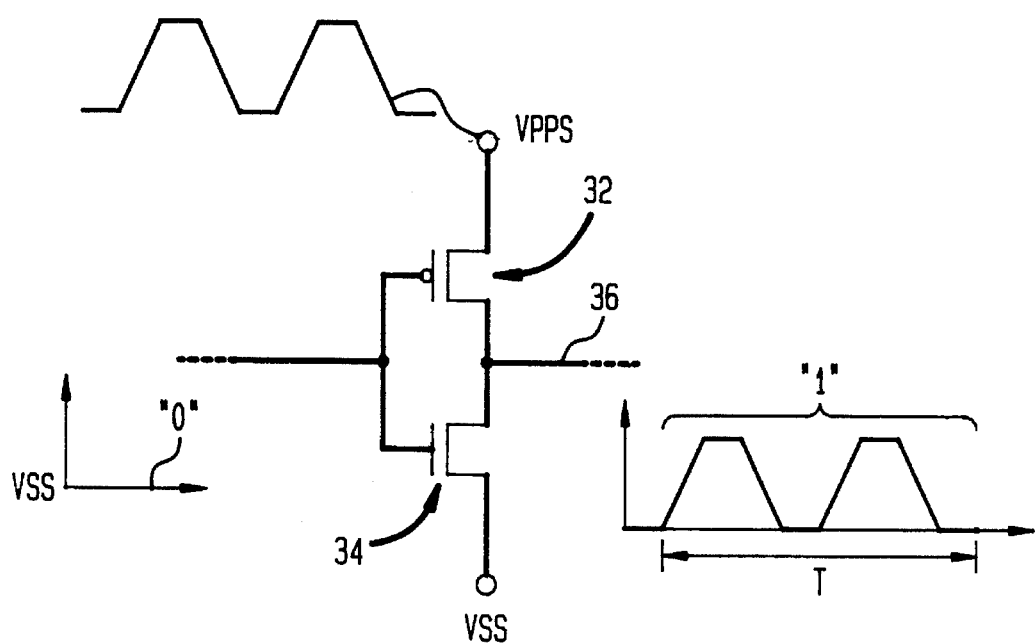

Similarly, conversion of a "0" data signal in conventional CMOS format to an inverted replica thereof in PPS format can be accomplished by, for example, the same aforementioned standard PPS CMOS inverter circuit. Thus, as illustrated in FIG. 3, assume that a "0" input data signal (zero volts) is applied to the connected-together gate electrodes of the devices 32 and 34. Such an input signal causes the p-channel device 32 to conduct and the n-channel device 34 to be rendered nonconducting. As a result, the output lead 36 of the circuit is in effect directly connected to VPPS via the relatively low-resistance source-to-drain path of the conducting device 32. Thus, during the time interval in which a "0" signal appears at the input of the FIG. 3 circuit, a "1"

signal will appear at the output thereof. As indicated in FIG. 3, such a "1" output signal is, for example, represented by a couplet of PPS pulses in the time interval designated T.

As mentioned earlier above, conversion circuits of the type shown in FIGS. 2 and 3 are advantageously included on the PPS chip 14 of FIG. 1. Also, since the particular depicted conversion circuits of FIGS. 2 and 3 perform an inversion operation, it is of course necessary at some appropriate point in the overall data processing cycle to in effect reinvert the converted signals, thereby re-establishing their original values.

Figure 4:
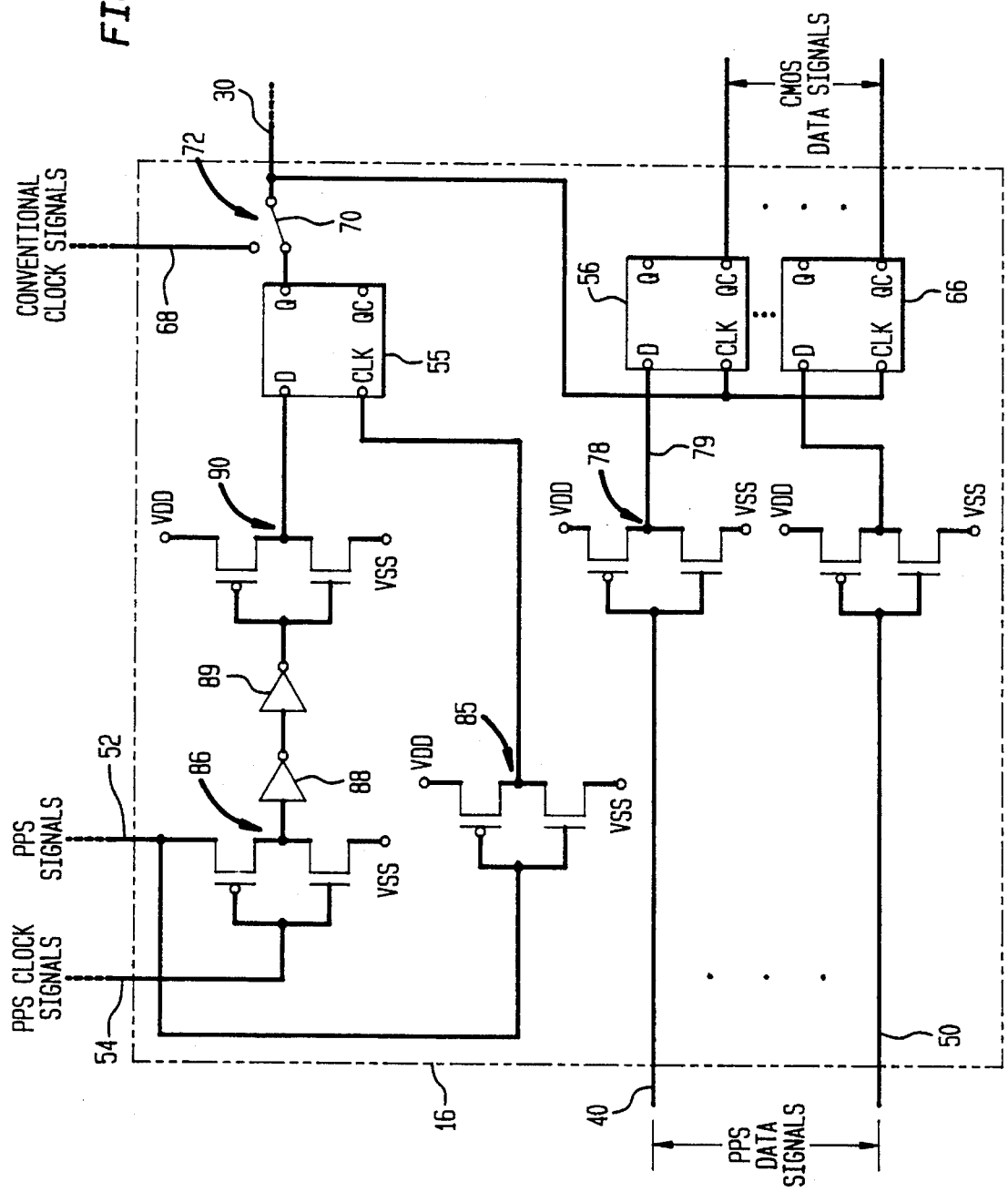
FIG. 4 shows in schematic form a specific illustrative translator circuit for converting PPS CMOS data signal representations to conventional CMOS data signal representations.

A specific illustrative embodiment of the translator 16 of FIG. 1 is shown in FIG. 4. As schematically depicted in FIG. 4, n PPS data signals are, for example, applied in parallel to the translator 16 via respective input leads 40 . . . 50. Also, PPS signals generated by the PPS oscillator portion of the box 18 of FIG. 1 are applied to the translator 16 of FIG. 4 via lead 52. In turn, the lead 52 is connected to the lead 20 shown in FIG. 1. Further, PPS clock signals derived from the clock generator portion of the box 18 of FIG. 1 are applied to the translator 16 of FIG. 4 via lead 54. In turn, the lead 54 is connected to the lead 22 shown in FIG. 1.

Illustratively, the shaped waveform of the PPS signals generated by the PPS oscillator portion of the box 18 of FIG. 1 and applied to the translator 16 of FIG. 4 via the lead 52 is represented by the top-most waveform 56 shown in FIG. 5. The maximum and minimum excursions of the depicted waveform 56 are indicated as being +5 and zero volts, respectively. Also, the shaped waveform 58 of the output of the PPS clock generator portion of the box 18 is shown in FIG. 5. As noted earlier, PPS clock signals having the waveform 58 are applied to the translator 16 via the lead 54.

Conventional (non-PPS) clock signals can be generated in the translator 16 of FIG. 4 in response to the concurrent application to the translator 16 of PPS signals of the type represented by the waveform 56 of FIG. 5 and to PPS clock signals of the type represented by the waveform 58, as will be described in detail later below. Such conventional clock signals appearing at the output of a conventional clock-signal-generating flip-flop 55 can be used in the translator 16 to time the operation of conventional data flip-flops 56 . . . 66. Alternatively, conventional clock signals provided by the reference oscillator 24 of FIG. 1 can be applied to the translator 16 of FIG. 4 via lead 68. By throwing the movable arm 70 of switch 72 in the translator 16 from its lower to its upper position, conventional clock signals from the reference oscillator 24 can be utilized to time the operation of the data flip-flops 56 . . . 66. On the other hand, with the arm 70 in its depicted position, conventional clock signals generated within the translator 16 are applied to the flip-flops 56 . . . 66 to time their operation. In either case, the conventional clock signals used to time the flip-flops 56 . . . 66 are, for example, of the particular form designated in FIG. 5 by reference numeral 74.

Assume that a "1" data signal in the PPS format appears on the input lead 40 extending to the translator 16 of FIG. 4. As described earlier above, such a signal comprises a couplet of PPS pulses. In particular, such an input "1" signal is represented in FIG. 5 by tile portion of waveform 76 that exists in the time interval t1-to-t8. As indicated in FIG. 5, the input data signal waveform 76 is advantageously in synchronism with both the PPS waveform 56 and the PPS clock signal 58.

As seen in FIG. 4, the PPS input data signals applied in parallel to the translator 16 via the plural input leads 40 . . . 50 are applied to the respective inputs of plural substantially identical conventional CMOS inverter circuits. Thus, for example, the PPS signals appearing on the input lead 40 are applied directly to the connected-together gate electrodes of an inverter circuit 78. As indicated in FIG. 4, each such conventional CMOS inverter circuit such as the circuit 78 is powered by a fixed-value power supply (VDD).

At a point subsequent to t1 shown in FIG. 5, the input data waveform 76 rises to a sufficiently positive level to cause the p-channel device of the inverter 78 to be rendered nonconductive and to cause the n-channel device of the inverter 78 to begin conducting. At that point, designated t2 in FIG. 5, the output of the inverter 78 appearing on lead 79 goes from VDD (+5 volts) to VSS (zero volts), as represented by waveform 80 in FIG. 5. Later, at t4, in response to a down-ramp portion of the input "1" signal, the output of the inverter 78 returns to the level VDD. In practice, the inverter 78 is advantageously designed (by sizing its p-channel device) such that positive-going transitions in the waveform 80 (such as the transition at t4) occur slightly delayed relative to positive-going transitions of the conventional clock waveform 74. In that way, the positive-going edge of the conventional clock signal 74 will be applied to the clock (CLK) input of the data flip-flop 56 sufficiently prior to the transition in the waveform 80 at t4 to in effect unequivocally capture the occurrence of the low-level value of the waveform 80 during the interval t2-to-t4.

Thus, each time a rising edge of the conventional clock waveform 74 (FIG. 5) is applied to the data flip-flops 56 . . . 66 of FIG. 4, whatever voltage levels are applied at that time to the D inputs of those flip-flops are respectively transferred to the outputs of the flip-flops. And each flip-flop output level thereby established remains constant until a next rising edge of the clock waveform 74 occurs at a time when the output of the respective inverter circuit connected to the D input of its associated flip-flop is at a different level than what it was at the time of the prior rising edge.

When the first depicted rising edge of the clock waveform 74 of FIG. 5 occurs at t3, the data signal 80 applied to the D input of the flip-flop 56 has a relatively low-level value. Hence, the output value appearing at the Q output of the flip-flop 56 at that time assumes a relatively low-level value, while the complementary output value appearing at the QC output of the flip-flop 56 assumes a relatively high-level value. Since the above-assumed signal 76 that was applied to the input lead 40 was a "1" data signal, the high-level or QC output of the flip-flop 56 is selected. This high-level signal, which commences at t3, is shown in FIG. 5 wherein it is designated by reference numeral 82. Such a waveform is representative of a "1" data signal in a conventional CMOS format. Accordingly, data signals appearing at the QC outputs of the flip-flops 56 . . . 66 are in the proper form to be applied to conventional CMOS circuitry for processing therein.

As suggested earlier above, the conventional clock signal 74 shown in FIG. 5 can be derived from the reference oscillator 24 of FIG. 1. In that case, clock signals are applied to the translator 16 (FIG. 4) via the lead 68 and the switch 70 to control the operation of the data flip-flops 56 . . . 66. However, to establish an especially reliable and accurate timing relationship with respect to the conventional CMOS data signals generated by the translator 16, it is often advantageous to generate the required conventional clock signals in the translator itself in direct response to PPS signals and PPS clock signals. By utilizing such translator-generated clock signals to time the operation of the data flip-flops 56 . . . 66 and to time data flow on other chips driven by the translator 16, highly reliable system operation is assured.

The circuitry included in the translator 16 of FIG. 4 to generate conventional clock signals (such as the clock signal 74 shown in FIG. 5) comprises the aforementioned conventional clock-signal-generating flip-flop 55. Timing signals of the type represented by waveform 84 in FIG. 5 are applied to the CLK input of the flip-flop 55. The waveform 84 is generated by a conventional CMOS inverter circuit 85 whose input comprises PPS signals (waveform 56 in FIG. 5). Illustratively, the waveforms 56 and 84 are approximately in phase (not delayed) with respect to each other.

Further, the clock-signal-generating circuitry in the translator 16 includes a PPS CMOS inverter circuit 86 whose input comprises a PPS clock signal of the type represented by waveform 58 of FIG. 5. In turn, the output of the circuit 86 is an inverted version of the waveform 58, as represented by waveform 87 in FIG. 5. Subsequently, the output 87 of the PPS inverter circuit 86 is propagated through an odd number of conventional CMOS, inverters 88 through 90. (Only the details of the circuit 90 of an illustrative three-inverter string are explicitly shown in FIG. 4.) As a result, the output waveform 87 of the circuit 86 is both sharpened and delayed before being applied to the D input of the flip-flop 55. By way of example, waveform 91 in FIG. 5 represents the particular signal applied to the D input of the flip-flop 55 from the output of the circuit 90.

The aforedescribed delay introduced by the inverter circuits 88 through 90 of FIG. 4 causes the waveform 91 (FIG. 5) applied to the D input of the flip-flop 55 to be delayed relative to the timing signals 84 applied to the CLK input of the flip-flop 55. As a result, the rising edges of the timing waveform 84 (which edges are indicated in FIG. 5 by small arrows) are assured of occurring away from transition points of the waveform 91. In that way, unequivocal concurrences of rising edges of the waveform 84 and positive or negative values of the waveform 91 are guaranteed.

More specifically, each time that a rising edge of the waveform 84 occurs at the CLK input of the flip-flop 55, the positive or negative level represented by the waveform 91 applied to the D input of the flip-flop 55 will in effect be transferred to the Q output of the flip-flop 55. As can be seen from FIG. 5, the result of this action is to provide the conventional clock waveform 74 at the Q output of the flip-flop 55.

Thus, the flip-flop 55 in the translator 16 can provide conventional clock signals 74 (FIG. 5) derived from PPS signals and PPS clock signals to time the operation of the data flip-flops 56 . . . 66 of FIG. 4. If desired, these conventional clock signals generated by the translator 16 can also be applied via lead 30 to conventional CMOS circuitry to time data flow therein.

Finally, it is to be understood that the above-described arrangements are only illustrative of the principles of the present invention. In accordance with these principles, numerous modifications and alternatives may be devised by those skilled in the art without departing from the spirit and scope of the invention.

What is claimed:

1. A hybrid data processing system comprising
   fixed-power-supply complementary metal-oxide-semiconductor (CMOS) circuitry,
   pulsed-power-supply (PPS) CMOS circuitry,
   first means interposed between said fixed-power-supply circuitry and said PPS circuitry and responsive to binary data signals provided by said fixed-power-supply CMOS circuitry for converting signals from a non-return-to-zero CMOS mode to corresponding binary data signals in a PPS binary data return-to-zero mode,
   and second means interposed between said PPS circuitry and said fixed-power-supply circuitry and responsive to binary data signals provided by said PPS CMOS circuitry for converting said signals in said PPS mode to corresponding binary data signals in said non-return-to-zero CMOS mode.

2. A system as in claim 1 wherein said first means comprises PPS CMOS inverter circuitry.

3. A system as in claim 2 wherein said binary data signals provided by said PPS CMOS circuitry appear respectively on plural lines, and wherein said second means further includes
   plural data flip-flops respectively associated with said plural lines, each of said flip-flops comprising a data input terminal, a clock input terminal and a data output terminal,
   plural fixed-power, supply CMOS inverter circuits respectively connected between said plural lines and said data input terminals and responsive to the binary representations of said PPS-mode signals for applying either a relatively positive voltage level or a relatively negative voltage level to its associated input terminal,
   and third means connected to said clock input terminals for timing the transfer of the voltage levels appearing at said flip-flop input terminals to the data output terminals, thereby to provide fixed-power-supply CMOS output signals.

4. A system as in claim 3 wherein said third means comprises a reference oscillator.

5. A system as in claim 3 wherein said third means comprises
   a PPS oscillator and clock generator for providing PPS-mode output reference signals comprising PPS signals and PPS clock signals,
   and fourth means responsive to said PPS-mode output reference signals for generating timing signals for application to said clock input terminals.

6. A system as in claim 5 wherein said fourth means comprises
   a timing flip-flop having a first clock input terminal, a second clock input terminal and a clock output terminal,
   fifth means responsive to the PPS signals provided by said oscillator and clock generator for generating timing signals and applying said timing signals to the second clock input terminal of said timing flip-flop,
   and sixth means responsive to the PPS signals and PPS clock signals provided by said oscillator and clock generator for providing timing signals to said first clock input terminal of said timing flip-flop which are delayed with respect to the timing signals provided to said second clock input terminal.

7. A system as in claim 6 further including means connecting the clock output terminal of said timing flip-flop to the clock input terminals of said data flip-flops.

* * * * *